US011848533B2

United States Patent
Kozuru

(10) Patent No.: US 11,848,533 B2
(45) Date of Patent: *Dec. 19, 2023

(54) LIGHT EMITTING DEVICE INCLUDING LIGHT-TRANSMISSIVE MEMBER AND LENS MEMBER

(71) Applicant: NICHIA CORPORATION, Anan (JP)

(72) Inventor: Kazuma Kozuru, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/960,970

(22) Filed: Oct. 6, 2022

(65) Prior Publication Data

US 2023/0022563 A1 Jan. 26, 2023

Related U.S. Application Data

(63) Continuation of application No. 16/790,090, filed on Feb. 13, 2020, now Pat. No. 11,500,275.

(30) Foreign Application Priority Data

Feb. 15, 2019 (JP) ................................ 2019-025353

(51) Int. Cl.
*H01S 5/02253* (2021.01)
*H01S 5/02255* (2021.01)
(Continued)

(52) U.S. Cl.
CPC ...... *H01S 5/02253* (2021.01); *H01S 5/02255* (2021.01); *H01S 5/02257* (2021.01);
(Continued)

(58) Field of Classification Search
CPC ............. G03B 21/2033; H01S 5/02253; H01S 5/02255; H01S 5/02257; H01S 5/005; H01S 5/02208; H01S 5/02325
See application file for complete search history.

(56) References Cited

U.S. PATENT DOCUMENTS

| 11,355,901 B1* | 6/2022 | Ginzburg | ................ H01S 5/023 |
| 2001/0046032 A1* | 11/2001 | Takezawa | ............ H04N 9/3105 353/30 |

(Continued)

FOREIGN PATENT DOCUMENTS

| JP | S57-083080 A | 5/1982 |
| JP | 2012-094728 A | 5/2012 |

(Continued)

OTHER PUBLICATIONS

Notice of Allowance dated Jul. 18, 2022 in U.S. Appl. No. 16/790,090.

*Primary Examiner* — Bao-Luan Q Le
(74) *Attorney, Agent, or Firm* — Foley & Lardner LLP

(57) ABSTRACT

A light emitting device includes: at least one semiconductor laser element; a base member on which the at least one semiconductor laser element is disposed; a light-transmissive member including: an upper surface, a lower surface, and a light-transmissive region through which laser light emitted from the at least one semiconductor laser element is transmitted from the lower surface to the upper surface; and a lens member through which the laser light emitted from the at least one semiconductor laser element, the lens member being fixed to the base member or the light-transmissive member. At least the light-transmissive region is made of sapphire. The light-transmissive member includes an incident surface on which the laser light is incident, the incident surface being an a-plane of the sapphire.

16 Claims, 10 Drawing Sheets

(51) Int. Cl.
  *H01S 5/02257* (2021.01)
  *G03B 21/20* (2006.01)
  *G03B 21/00* (2006.01)
  *H01S 5/40* (2006.01)

(52) U.S. Cl.
  CPC ........ *G03B 21/006* (2013.01); *G03B 21/2033* (2013.01); *G03B 21/2073* (2013.01); *H01S 5/4031* (2013.01)

(56) References Cited

U.S. PATENT DOCUMENTS

| | | | | |
|---|---|---|---|---|
| 2002/0044748 A1* | 4/2002 | Tatoh | ............... | G02B 1/02 385/94 |
| 2005/0205884 A1* | 9/2005 | Kim | ............... | H01L 33/18 257/E33.003 |
| 2005/0214992 A1* | 9/2005 | Chakraborty | ....... | H01L 21/0262 257/E21.113 |
| 2005/0236627 A1* | 10/2005 | Kim | ............... | H01L 33/18 257/79 |
| 2005/0245095 A1* | 11/2005 | Haskell | ............. | H01L 21/02433 257/E21.112 |
| 2006/0128124 A1* | 6/2006 | Haskell | ............... | C30B 25/02 438/483 |
| 2006/0175618 A1* | 8/2006 | Ishida | ................. | H01S 5/34333 257/E29.253 |
| 2007/0111488 A1* | 5/2007 | Chakraborty | ..... | H01L 21/02458 257/E21.108 |
| 2007/0184637 A1* | 8/2007 | Haskell | ............... | H01L 21/0242 438/481 |
| 2009/0034568 A1* | 2/2009 | Nakahara | .......... | H01L 21/02403 257/E29.094 |
| 2009/0146160 A1* | 6/2009 | Nakahara | .............. | H01L 33/007 257/94 |
| 2009/0267062 A1* | 10/2009 | Nakahara | ............ | H01L 29/7787 257/E29.081 |
| 2010/0243988 A1* | 9/2010 | Kamikawa | .......... | H01S 5/34333 438/46 |
| 2012/0002134 A1* | 1/2012 | Yokogawa | .......... | H01L 25/0753 438/46 |
| 2012/0045661 A1* | 2/2012 | Kumaran | ................ | C30B 23/02 252/301.4 R |
| 2012/0049156 A1* | 3/2012 | Ohta | ................... | H01L 21/0254 257/E33.027 |
| 2012/0091490 A1* | 4/2012 | Fujikane | ................ | H01L 33/54 438/46 |
| 2012/0199844 A1* | 8/2012 | Yokogawa | .............. | H01L 33/32 257/E29.089 |
| 2012/0244686 A1* | 9/2012 | Kato | ....................... | C30B 25/02 257/E21.108 |
| 2012/0294565 A1* | 11/2012 | Iida | ........................ | G02F 1/093 385/14 |
| 2013/0050824 A1* | 2/2013 | Iida | ...................... | G02B 5/3083 359/484.03 |
| 2013/0126900 A1* | 5/2013 | Inoue | ..................... | H01L 33/54 257/76 |
| 2013/0168733 A1* | 7/2013 | Iwanaga | ............. | H01L 21/0242 257/190 |
| 2013/0207150 A1* | 8/2013 | Inoue | ..................... | H01L 33/60 438/27 |
| 2013/0265770 A1* | 10/2013 | Breidenassel | ....... | H01S 5/02253 362/296.01 |
| 2013/0272329 A1* | 10/2013 | Auen | .................. | H01S 5/02216 372/34 |
| 2013/0329397 A1* | 12/2013 | Shimizu | ................... | F21V 7/26 362/84 |
| 2014/0077223 A1* | 3/2014 | Choe | ....................... | H01L 33/18 438/478 |
| 2014/0269801 A1* | 9/2014 | Choe | ............... | H01L 21/02579 372/44.011 |
| 2015/0029475 A1* | 1/2015 | Shimizu | ............. | G03B 21/2033 353/98 |
| 2015/0049307 A1* | 2/2015 | Kashihara | .......... | G03B 21/2073 353/31 |
| 2015/0176816 A1* | 6/2015 | Umehara | .............. | G06F 1/1656 362/253 |
| 2016/0231084 A1* | 8/2016 | Flaster | ....................... | F41G 1/35 |
| 2016/0341395 A1* | 11/2016 | Kiyota | ..................... | F21V 5/007 |
| 2019/0052052 A1* | 2/2019 | Takahira | .............. | H01S 5/32341 |
| 2019/0323663 A1* | 10/2019 | Rudy | ...................... | F21V 29/70 |
| 2021/0336411 A1* | 10/2021 | Dejima | ................ | H01S 5/0237 |
| 2022/0018632 A1* | 1/2022 | Flaster | ............... | H01S 5/02253 |

FOREIGN PATENT DOCUMENTS

| | | |
|---|---|---|
| JP | 2019-003209 A | 1/2019 |
| WO | WO-2017/043122 A1 | 3/2017 |

\* cited by examiner

LIGHT EMITTING DEVICE INCLUDING LIGHT-TRANSMISSIVE MEMBER AND LENS MEMBER

CROSS-REFERENCE TO RELATED APPLICATION

This application is a continuation of U.S. patent application Ser. No. 16/790,090, filed on Feb. 13, 2020, which claims priority to Japanese Patent Application No. 2019-025353, filed on Feb. 15, 2019. The contents of these applications are hereby incorporated by reference in their entireties.

BACKGROUND

1. Technical Field

The present disclosure relates to a light emitting device and an optical device including the light emitting device.

2. Description of Related Art

JP 2012-94728 A describes a semiconductor laser device in which a semiconductor laser element is hermetically sealed with a substrate and a cap, and a light-transmissive member disposed in a region where light from the semiconductor laser element passes through.

There is also an optical device in which the polarization characteristic of light emitted from a light source is considered for utilization of the emitted light, such as a liquid crystal projector described in JP 2019-3209 A.

SUMMARY

An object of the present disclosure is to obtain a light emitting device with a good polarization ratio.

A light emitting device according to one embodiment of the present disclosure includes: a semiconductor laser element; and a light-transmissive member including an upper surface, a lower surface, and a light-transmissive region through which laser light emitted from the semiconductor laser element is transmitted from the lower surface to the upper surface. At least the light-transmissive region is made of sapphire. The light-transmissive member includes an incident surface on which the laser light is incident, the incident surface being an a-plane of sapphire. The light-transmissive member is oriented so that a polarization direction of the laser light incident on the incident surface is parallel or perpendicular to the c-axis of sapphire in a top view.

A light emitting device according to one embodiment of the present disclosure includes: a semiconductor laser element; and a light-transmissive member including an upper surface, a lower surface, a light-transmissive region through which laser light emitted from the semiconductor laser element is transmitted from the lower surface to the upper surface. At least the light-transmissive region is made of sapphire. The laser light emitted from the semiconductor laser element has a far-field pattern of an oval shape. The light-transmissive member includes an incident surface on which the laser light is incident, the incident surface being an a-plane of sapphire. The light-transmissive member is oriented so that a direction corresponding to a major-axis direction of the oval shape of the laser light is parallel or perpendicular to the c-axis of sapphire in a top view.

An optical device according to one embodiment of the present disclosure includes: the light emitting device according to one embodiment of the present disclosure; a polarizer element on which light emitted from the light emitting device is incident; a liquid crystal panel on which light emitted from the light emitting device and transmitted through the polarizer element is incident; and a projection lens projecting a projection image created according to light emitted from the light emitting device.

The present disclosure implements a light emitting device with a good polarization ratio.

DETAILED DESCRIPTION

Figure 1:
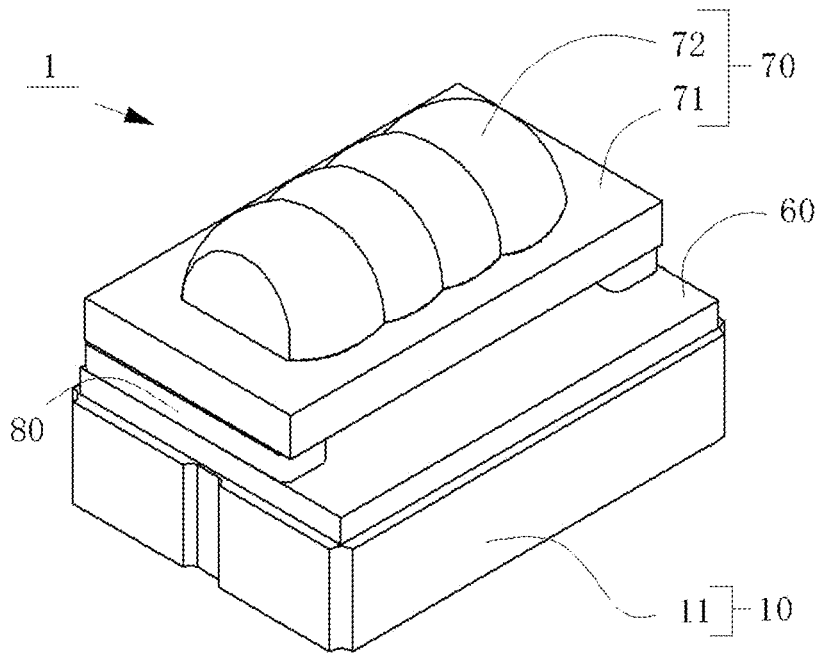
FIG. 1 is a schematic perspective view of a light emitting device according to an embodiment.

In the description and the claims, the term "polygonal shape" encompasses polygonal shapes such as triangular shapes, quadrangular shapes, and the like with modified corners such as rounded corners, truncated corners, etc. The term "polygonal shape" also encompasses polygonal shapes with modification at intermediate portions of sides of the polygonal shapes (i.e., portions other than ends of sides of the polygonal corners). That is, a polygonal shape with modification should be construed as "a polygon" recited in the description and claims.

Similarly, other terms indicating specific shapes, such as a circle, a recess, a projection, etc., encompass respective shapes with modification. This is similar for each side forming such a shape. That is, a side having ends with modification and/or an intermediate portion with modification should be construed as "a side." When indicating "a polygonal shape" or "a side" without intended modification separately from a modified "polygonal shape" or a modified "side", such shapes without intended modification are referred to with the term "strict", such as "a strict quadrangle."

In the description and claims, when a plurality of elements correspond to a single constituent and are to be indicated separately from each other, the term of such elements are referred to with the words "first," "second," etc. Such indication of elements with the words "first," "second," etc., for indicating the elements corresponding to a single constituent separately from each other may be different between the description and claims, when the elements to be indicated as "first," "second," etc., or the view of separation between "first," "second," etc., is different between the description and claims.

With reference to the drawings, certain embodiments of the present invention will be described below. Embodiments described below are intended to give a concrete form to the technical idea of the present invention, and are not intended to limit the scope of the present invention. In the description below, identical names and identical reference numerals indicate identical or similar members, and repetitive description thereof may be omitted as appropriate. The size or positional relationship of members in the drawings may be exaggerated for the sake of clarity.

Embodiments

Figure 2:
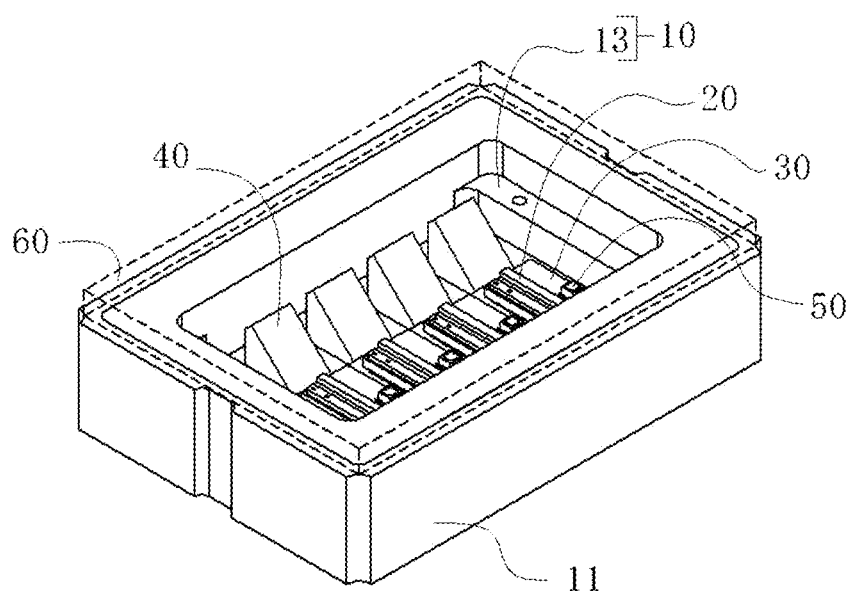
FIG. 2 is a schematic perspective view for describing the constituents of the light emitting device according to the embodiment of FIG. 1.
Figure 3:
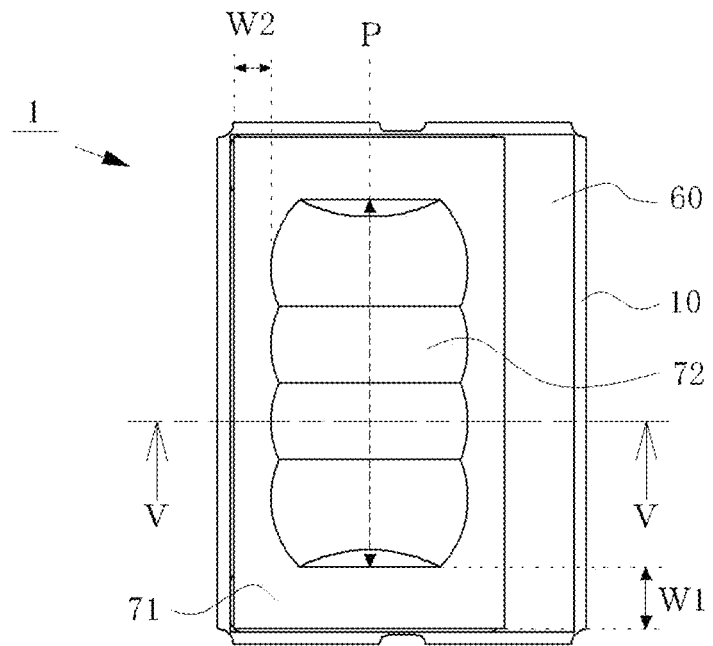
FIG. 3 is a schematic top view of the light emitting device according to the embodiment of FIG. 1.
Figure 4:
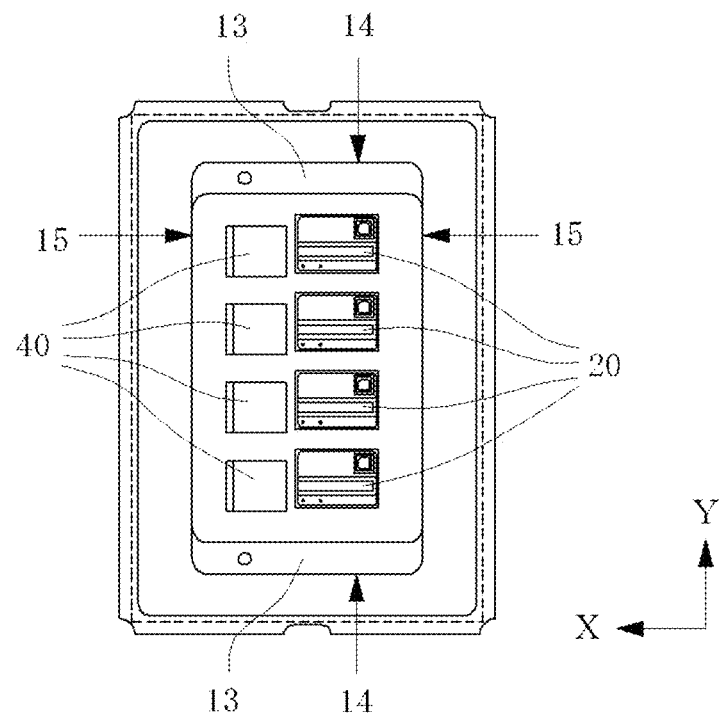
FIG. 4 is a schematic top view for describing the constituents of the light emitting device according to the embodiment of FIG. 1.
Figure 5:
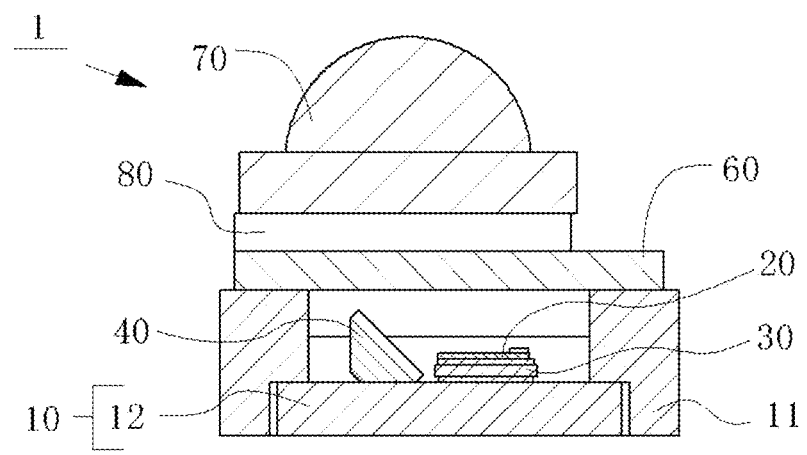
FIG. 5 is a schematic cross-sectional view of the light emitting device according to the embodiment of FIG. 1, taken along line V-V in FIG. 3.
Figure 6:
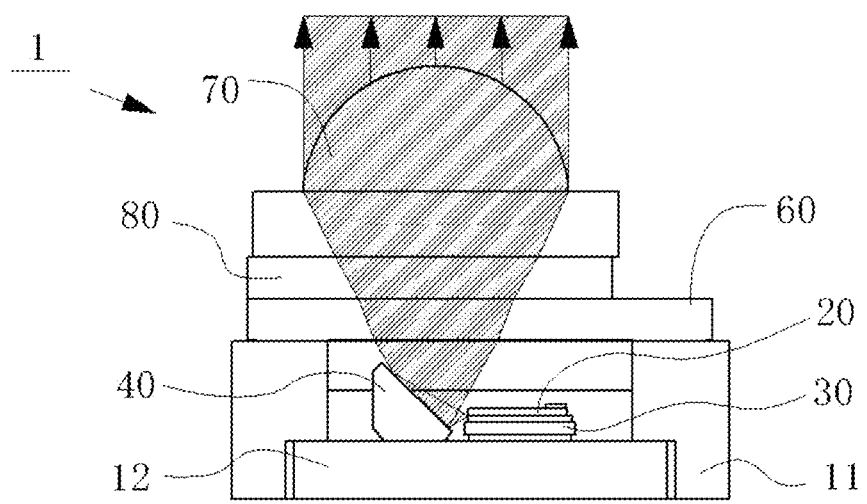
FIG. 6 is a schematic cross-sectional view showing the light emission region of the light emitting device according to the embodiment of FIG. 1, corresponding to the cross-sectional view of FIG. 5.
Figure 7:
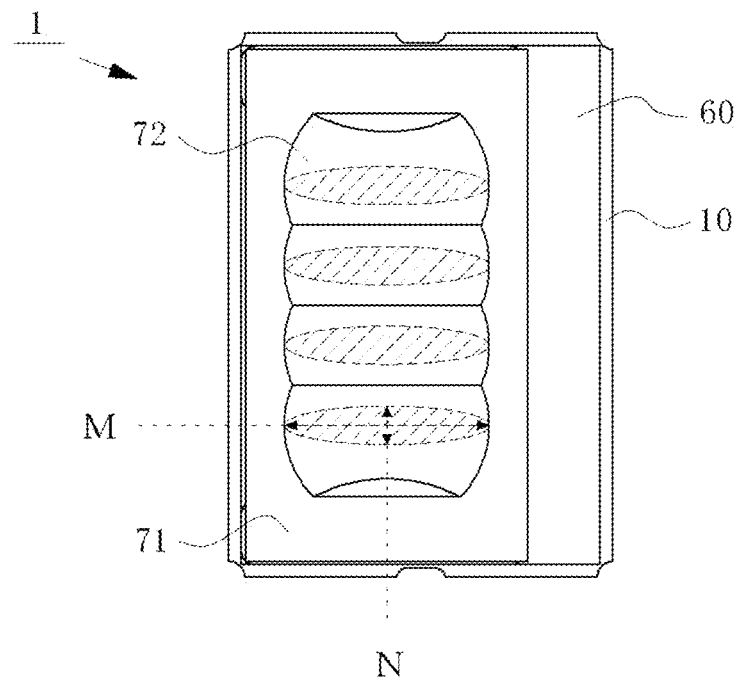
FIG. 7 is a schematic top view showing the light emission region in the light-transmissive member of the light emitting device according to the embodiment of FIG. 1.
Figure 8:
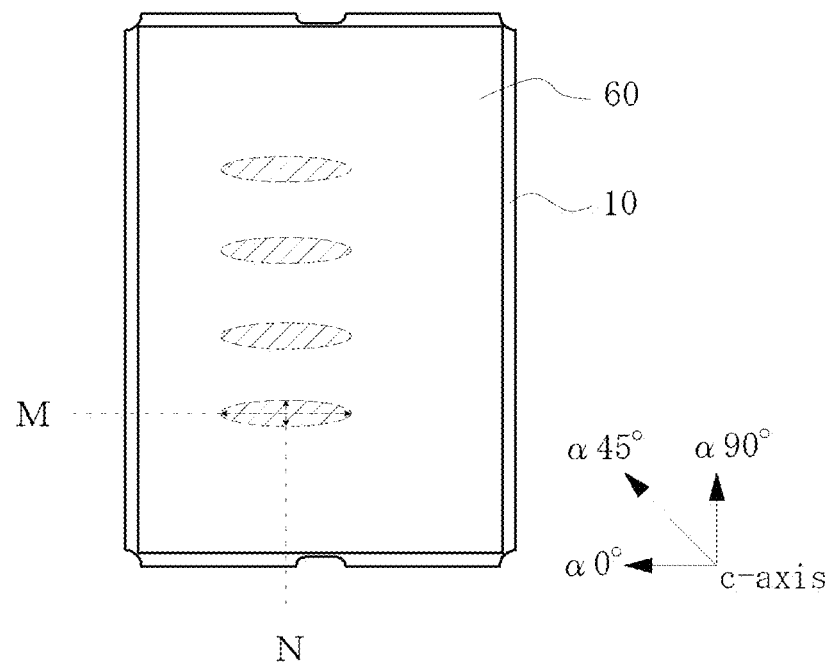
FIG. 8 is a schematic top view showing the light emission region in a lens member of the light emitting device according to the embodiment of FIG. 1.

FIG. 1 is a schematic perspective view of a light emitting device 1 according to one embodiment. FIG. 2 is a schematic perspective view of the light emitting device 1 in which some components are not shown for the purpose of showing the disposition of the constituents of semiconductor laser elements 20 in the light emitting device 1. In FIG. 2, a light-transmissive member 60 is indicated by broken lines to be shown in a transparent manner. FIG. 3 is a schematic top view of the light emitting device 1. FIG. 4 is a schematic top view corresponding to the perspective view of FIG. 2. FIG. 5 is a schematic cross-sectional view of the light emitting device 1 taken along line V-V in FIG. 3. FIG. 6 is a schematic cross-sectional view showing an emission region of light emitted from the semiconductor laser element 20, corresponding to the cross-sectional view of FIG. 5. In FIG. 6, the components of the light emitting device 1 hatched in FIG. 5 are not hatched, and instead the light emission region is hatched and represented by arrows. FIG. 7 is a schematic top view showing the light emission region in a lens member 70 of the light emitting device 1. FIG. 8 is a schematic top view showing the light emission region in the light-transmissive member 60 of the light emitting device 1. FIGS. 7 and 8 show the light emission regions of the main portion of light as hatched regions defined by the broken lines.

The light emitting device 1 includes a base member 10, four semiconductor laser elements 20, four submounts 30, four light-reflective members 40, four protective elements 50, a light-transmissive member 60, and a lens member 70. An adhesive part 80 formed of an adhesive agent is disposed between the light-transmissive member 60 and the lens member 70.

The base member 10 has a quadrangular outer shape in a top view, and defines a recess located inward of an outer periphery of the base member 10. That is, the base member 10 includes a recess part that is recessed from an upper surface of the base member 10 toward a lower surface of the base member 10. The base member 10 includes the upper surface, an upward-facing surface, a lower surface, inner lateral surfaces, and outer lateral surfaces. In a top view, the upper surface forms a frame, and the recess is located inward of the frame. The base member 10 includes stepwise portions 13 in the recess and, accordingly, includes step upper surfaces and step lateral surfaces that form the stepwise portions 13.

The upper surface intersects with the inner lateral surfaces and the outer lateral surfaces. The lower surface of the base member 10 intersects with the outer lateral surfaces of the base member 10. In a top view, the inner lateral surfaces form a quadrangular shape. The inner lateral surfaces consist of four lateral surfaces corresponding to the sides of this quadrangular shape. The upward-facing surface forms an upper surface serving as the bottom of the recess, and is located higher than the lowermost surface of the base member 10 and lower than the uppermost surface of the base member 10.

The stepwise portions 13 are located over the entire length of two opposite lateral surfaces of four lateral surfaces that form the inner lateral surface. Other two lateral surfaces are not provided with the stepwise portions 13 excluding intersecting portions. As used herein, an "intersecting portion" refers to a portion where two lateral surfaces intersect with each other at respective corresponding ends of the lateral surfaces.

The two opposite lateral surfaces of the four lateral surfaces forming the inner lateral surface are referred to as "first lateral surfaces 14," and the other two lateral surfaces of the four lateral surfaces are referred to as "second lateral surfaces 15." A direction parallel to the first lateral surfaces 14 in a top view is referred to as a "first direction X," and a direction parallel to the second lateral surfaces 15 in a top view is referred to as a "second direction Y" (see FIG. 4). The outer shape of the base member 10 in a top view is a quadrangular shape that is longer in the second direction Y than in the first direction X. Furthermore, in the light emitting device 1, the first direction X and the second direction Y are referred to as a "plane direction," and a direction perpendicular to the first direction X and the second direction Y is referred to as a "height direction."

In each of regions where the stepwise portions 13 are formed, the step lateral surface intersects with the upward-facing surface, and the step upper surface intersects with the inner lateral surface. In each of regions where the stepwise portions 13 are not formed, the upward-facing surface and the inner lateral surface intersects with each other. The region where the stepwise portion 13 are formed may have other appropriate configurations. The stepwise portion 13 may be located at a single lateral surface, or at three or more lateral surfaces.

The base member 10 includes a bottom part 12 including the upward-facing surface, and a frame part 11 that includes the inner lateral surface and the stepwise portions 13 and forms a frame surrounding the bottom part 12 or the upward-facing surface. In the base member 10, the bottom part 12 and the frame part 11 are joined to each other. The bottom part 12 and the frame part 11 are made of different main materials. For example, in the base member 10, a ceramic may be used for a main material of the frame part 11, and a metal having a thermal conductivity higher than a ceramic may be used for the main material of the bottom part 12.

Examples of such a ceramic include aluminum nitride, silicon nitride, aluminum oxide, and silicon carbide. Examples of such a metal include copper, aluminum, iron, and alloy such as copper molybdenum, copper tungsten, and copper-diamond.

The base member 10 may not be formed of separate parts, such as the bottom part 12 and the frame part 11 separated from each other. For example, the base member 10 may be formed of a single member of which a main material is ceramic. For the base member 10, materials other than a ceramic may be used; for example, a metal may be used.

The lower surface of the base member and the step upper surfaces 10 are provided with respective metal films. The metal film on the lower surface and the metal film on each step upper surface are connected to each other via a metal passing inside the base member 10 and, therefore, can be electrically connected to each other. The metal films may be provided in other regions in the base member 10. For example, the metal films may be disposed on the upward-facing surface instead of each step upper surface, and on the upper surface or the outer lateral surfaces of the base member 10 instead of the lower surface of the base member 10.

The outer shape of each semiconductor laser element 20 has an elongated-rectangular shape in a top view. A lateral surface intersecting with one of two short sides of the elongated-rectangular shape functions as an emission end surface for light emitted from the semiconductor laser element 20. Each of the upper surface and the lower surface of each semiconductor laser element 20 has an area greater than an area of the emission end surface.

Light (laser light) emitted from each semiconductor laser element spreads to form an oval far-field pattern (hereinafter referred to as "the FFP") in a plane parallel to the light emission end surface. The FFP is a shape and intensity distribution of emitted light at a position spaced apart from the emission end surface. In the light intensity distribution, a portion of emitted light having an intensity is $1/e^2$ or more with respect to the peak light intensity is referred to as a "main-portion light"

The FFP of light emitted from each semiconductor laser element 20 has an oval shape, which is shorter in a layer direction along each of a plurality of semiconductor layers including an active layer than in a layered direction, in which the plurality of semiconductor layers are layered, perpendicular to the layer direction. The layer direction (the minor-axis direction of the oval shape) may be referred to as a "parallel direction of the FFP," and the layered direction (the major-axis direction of the oval shape) may be referred to as a "perpendicular direction of the FFP."

As used herein, according to the light intensity distribution of the FFP, an angle corresponding to the full width at half maximum in the light intensity distribution is referred to as a "divergence" of light emitted from the semiconductor laser element. A divergence of light in the perpendicular direction of the FFP is referred to as a "divergence in the perpendicular direction," and a divergence of light in a parallel direction of the FFP is referred to as a "divergence in the parallel direction."

For the semiconductor laser elements 20, a semiconductor laser elements configured to emit blue light can be employed. Alternatively, semiconductor laser elements configured to emit green light or red light, or light of other colors may be employed.

As used herein, the term "blue light" refers to light having peak emission wavelength in a range of 420 nm to 494 nm. The term "green light" as used herein refers to light having a peak emission wavelength in a range of 495 nm to 570 nm. The term "red light" as used herein refers to light having a peak emission wavelength in a range of 605 nm to 750 nm. Examples of the semiconductor laser elements configured to emit blue light include semiconductor laser elements containing a nitride semiconductor. Examples of the nitride semiconductor include GaN, InGaN, and AlGaN.

Each submount 30 has a flat rectangular prism-shape, and includes an upper surface, a lower surface, and lateral surfaces. Of lengths of each submount 30, a length in the top-bottom direction is the smallest. Each submount 30 may have any appropriate shape other than a rectangular prism. The submounts 30 are formed of, for example, silicon nitride, aluminum nitride, or silicon carbide. Any other appropriate material may be employed for the submounts 30.

Each light-reflective member 40 includes a light-reflective surface that reflects light. The light-reflective surface is inclined relative to a lower surface of the light-reflective member 40. That is, the light-reflective surface is not perpendicular or parallel to the lower surface of light-reflective member 40. For example, the light-reflective surface may be a flat surface (an inclined surface) at an inclination angle of 45 degrees relative to the lower surface of the light-reflective member 40. The light-reflective surface may be a curved surface.

For a main material of the light-reflective members 40 that forms the outer shape of the light-reflective members 40, a glass, a metal, etc., can be employed. The main material of the light-reflective members 40 is preferably heat resistant, and for example, quartz or glass such as BK7 (borosilicate glass), a metal such as aluminum, or Si can be used.

The light-reflective surface may have a light reflectance of 99% or more for the peak wavelength of laser light to be reflected. For such a light-reflective surface, a metal such as Ag or Al, or a multilayer dielectric film of $Ta_2O_5/SiO_2$, $TiO_2/SiO_2$, $Nb_2O_5/SiO_2$ or the like may be used. A light reflectance of the light-reflective surface is equal to or less than 100%.

The protective elements 50 serve to prevent breakdown of specific elements (for example, the semiconductor laser elements 20). Examples of the protective elements 50 include Zener diodes for which Si is used.

The light-transmissive member 60 has a flat rectangular prism-shape, and includes an upper surface, a lower surface, and lateral surfaces. Of lengths of the light-transmissive member 60, a length in the top-bottom direction is smallest.

As used herein, the expression "light transmissive" refers to having a light transmittance of 80% or more. The light-transmissive member 60 may have any appropriate shape other than a rectangular prism-shape. The light-transmissive member 60 may partially include a region that is not light-transmissive.

Sapphire is used for a main material of the light-transmissive member 60. The light-transmissive portion in the light-transmissive member 60 is made of sapphire. Sapphire has a relatively high refractive index and also has a relatively high strength. The light-transmissive member 60 is made of an undoped material.

The lower surface or the upper surface of the light-transmissive member 60 is a plane parallel to the c-axis in the plane orientation of sapphire. More specifically, the lower surface or the upper surface of the light-transmissive member 60 is the a-plane, or may be the m-plane. Alternatively, the lower surface or the upper surface of the light-transmissive member 60 is the c-plane in the plane orientation of sapphire.

The width (thickness) of the light-transmissive member 60 between an upper surface and a lower surface of the light-transmissive member 60 may be in a range of 0.2 mm to 1.0 mm, preferably 0.3 mm to 0.6 mm. The area of the upper surface of the lower surface may be in the range of 2.0 $mm^2$ to 100 $mm^2$, preferably 9.0 $mm^2$ to 50 $mm^2$. Such dimension allows for contributing to downsizing of the light emitting device 1 while maintaining sufficient strength of the light emitting device 1. The light-transmissive member 60 may have any appropriate dimensions other than this range.

The adhesive part 80 is obtained by curing an adhesive agent. For the adhesive agent forming the adhesive part 80, UV-curing resin can be used. UV-curing resin is cured within relatively short time without the necessity of heating.

The lens member 70 has a shape in which lenses are disposed on a flat upper surface, and includes an upper surface, a lower surface, and lateral surfaces. Accordingly, while the lower surface of the lens member 70 is a flat surface, the upper surface of the lens member 70 includes a planar region 71 intersecting with the lateral surfaces of the lens member 70 and being parallel to the lower surface of the lens member 70, and a lens region 72 forming lens surfaces. The lens region 72 is surrounded by the planar region 71, and the lens shape is formed at a location higher than the flat surface.

The lens region 72 includes a shape in which a plurality of lenses are connected in a single direction. More specifically, four lenses are connected in a single lateral surface direction in a top view. In the lens member 70, in a top view, a length in the single lateral surface direction (the connecting direction P) is greater than a length perpendicular to the length in the single lateral surface direction (see FIG. 3). In a top view, the length in the direction of a line crossing all the four lenses is greater than the length in the direction of a line perpendicular the line crossing all the four lenses.

Further, in the planar region 71, a width W1, which is a shortest distance (width) between a position on the planar region 71 intersecting with the lateral surface and the lens region 72 in the connecting direction P, is greater than width W2, which is a shortest distance (width) between a position on the planar region 71 intersecting with the lateral surface and the lens region 72 in a direction perpendicular to the connecting direction P (see FIG. 3). In view of downsizing the light emitting device 1, preferably this relationship is established with at least one of two lateral surfaces parallel to the connecting direction P. The lens member 70 may be formed of glass such as BK7, for example.

Next, the light emitting device 1 including components as described above will be described. The semiconductor laser elements 20 and the protective elements 50 are mounted on the submounts 30. A single semiconductor laser element 20 and a single protective element 50 are disposed on each of the submounts 30. Accordingly, four submounts 30 are provided for four semiconductor laser elements 20.

A plurality of semiconductor laser elements 20 or a plurality of protective elements 50 may be disposed on a single submount 30. Each protective element 50 may be disposed at a position other than the submounts 30. The light emitting device 1 may not include the protective elements 50.

A metal film is disposed on the upper surface of each submount 30. A corresponding semiconductor laser element 20 and a corresponding protective element 50 are disposed on and bonded to the metal film. The lower surface of the semiconductor laser element 20 is bonded to the metal film at a predetermined position such that the emission end surface of the semiconductor laser element 20 aligns with or is located outward of a corresponding lateral surface of the submount 30. Such a disposition allows for inhibiting light emitted from the semiconductor laser element 20 from being incident on the upper surface of the submount 30.

Note that, when the emission end surface of the semiconductor laser element 20 is located outward of a corresponding lateral surface of the submount 30, an excessively great distance between the emission end surface of the semiconductor laser element 20 and the corresponding lateral surface of the submount 30 may cause the bonding unstable, and accordingly the emission end surface of the semiconductor laser element 20 and the corresponding lateral surface of the submount 30 may be spaced apart from each other at a slight distance. For example, the distance between the emission end surface of the semiconductor laser element 20 and the corresponding lateral surface of the submount 30 is preferably 0.05 mm or less. The semiconductor laser element 20 may be disposed such that the emission end surface of the semiconductor laser element 20 is located inward of a corresponding lateral surface of the submount 30, at a position where the light is not incident on the upper surface of the submount 30.

The submount 30 can function to release heat generated at the semiconductor laser element 20. More specifically, the submount 30 is formed with a material having a thermal conductivity higher than that of the semiconductor laser element 20. Accordingly, when the submount 30 has this heat-releasing function, the submount 30 can be regarded as a heat dissipating member.

In view of heat dissipation property, the submount 30 preferably has a thermal conductivity higher than a thermal conductivity of the upward-facing surface of the base member 10. For example, when the upward-facing surface of the base member 10 is made of aluminum nitride, silicon carbide is preferably used for the submount 30.

Each submount 30 can be used to adjust the emission position of light from a corresponding semiconductor laser element 20. When determining the emission position of light according to the disposition position of other components, a thickness of each submount 30 is set to a predetermined value, and a corresponding semiconductor laser element 20 is disposed on the submount 30. For example, in the light emitting device 1, the emission position is determined according to the positional relationship with the light-reflective members 40. When the submounts 30 are used to adjust the emission position of light from the semiconductor laser element 20 the submounts 30 can be regarded adjustment members.

Next, the submounts 30 are disposed on the upward-facing surface of the base member 10. That is, the semiconductor laser elements 20 or the protective elements 50 are disposed on the upward-facing surface side of the base member 10. The four submounts 30 are disposed such that the emission end surfaces of respective corresponding semiconductor laser elements 20 are in the same plane. The emission end surfaces may not be in the same plane, and disposition positions of the submounts 30 may individually adjusted.

The four submounts 30 are arranged between opposite first lateral surfaces 14 or opposite stepwise portions 13. The four submounts 30 are arranged in the second direction Y. Light emitted from the disposed semiconductor laser elements 20 propagates toward one of opposite second lateral surfaces 15, or in the first direction X.

The FFP's of light emitted from the four semiconductor laser elements 20 are identical to one another in the perpendicular direction and the parallel direction. As used herein, the expression "identical" permits a difference of 3 degrees or less. Light emitted from each semiconductor laser element 20 and propagating along the optical axis advances in the first direction X. A portion of light forming the major axis of the oval FFP is projected on a line perpendicular to the upward-facing surface. A portion of light forming the minor axis of the FFP is projected on a line in the second direction Y.

The direction of the line on which the light forming the major axis of the FFP is projected is referred to as a "direction M corresponding to the perpendicular direction of the FFP," and the direction of the line on which the light forming the minor axis of the FFP is projected is referred to as a "direction N corresponding to the parallel direction of the FFP."

Accordingly, the perpendicular direction of the FFP of light emitted from the semiconductor laser element 20 corresponds to the direction perpendicular to the upward-facing surface, and the parallel direction of the FFP of light emitted from the semiconductor laser element 20 corresponds to the second direction Y.

Next, the light-reflective members 40 are disposed on the upward-facing surface of the base member 10. A single light-reflective member 40 is disposed for each submount 30 or for each semiconductor laser element 20. A single light-reflective member 40 may be disposed for a plurality of submounts 30 or a plurality of semiconductor laser elements 20.

Each light-reflective member 40 is disposed so that the main-portion light emitted from a corresponding semiconductor laser element 20 is incident on the light-reflective surface. Accordingly, each light-reflective member 40 is located at a position in the propagation direction of light emitted from the corresponding semiconductor laser element 20, and provided with the light-reflective surface. The four light-reflective members 40 are disposed such that their respective light-reflective surfaces are aligned in the same plane. The light-reflective surfaces may not necessarily be aligned in the same plane.

The four light-reflective members 40 are arranged between opposite first lateral surfaces 14 or opposite stepwise portions 13. The four light-reflective members 40 are arranged in the second direction Y. Each of the four light-reflective members 40 is disposed between a respective one of the semiconductor laser elements 20 and the second lateral surface 15 toward which light emitted from the semiconductor laser elements 20 is to be propagated.

The light-reflective members 40 are disposed to be spaced apart from the submounts 30 or the semiconductor laser elements 20 at a predetermined distance. Accordingly, when regarding a single semiconductor laser element 20 and a single light-reflective member 40 on which main-portion light emitted from the single semiconductor laser element 20 is incident as a single light emitting unit, a distance between a corresponding submount 30 and a corresponding light-reflective member 40 or a distance between a corresponding semiconductor laser element 20 and a corresponding light-reflective member 40 is uniform among the four light emitting units.

In the light emitting device 1, light propagating along the optical axis propagates in the direction parallel to the upper surface of a corresponding submount 30, reflected by the light-reflective surface, and propagates upward perpendicularly to the upward-facing surface. As shown in FIG. 7, reflection by the light-reflective surface causes the direction M corresponding to the perpendicular direction of the FFP to be changed from the direction perpendicular to the upward-facing surface to the first direction X. The reflection by the light-reflective surface does not cause change of the direction N corresponding to the parallel direction of the FFP, and the direction N remains to be the second direction Y.

Next, in order to electrically connect the semiconductor laser elements 20 and the protective elements 50, wirings are bonded. By the wirings, the semiconductor laser elements 20 and the protective elements 50 are electrically connected to the metal films disposed on the step upper surfaces. Accordingly, the semiconductor laser elements 20 and the protective elements 50 are supplied with power from an external power supply via the metal film disposed on the lower surface of the base member 10.

Next, the light-transmissive member 60 is disposed on the upper surface of the base member 10. The lower surface of the light-transmissive member 60 and the upper surface of the base member 10 are bonded to each other. A metal film for bonding with the base member 10 is disposed in the vicinity of the outer edge of the lower surface of the light-transmissive member 60.

With this metal film, the light-transmissive member 60 is secured to the base member 10 via Au—Sn or the like.

The light-transmissive member 60 is has a size such that an outer periphery of the light-transmissive member 60 located in the vicinity of the outer lateral surfaces of the base member 10 in a top view. More specifically, for example, the light-transmissive member 60 has a size such that the light-transmissive member 60 overlaps 70% or more of a length between the outer lateral surface and the inner lateral surface in the upper surface of the base member 10. This allows for increasing a bonding area with the upper surface of the base member 10. Furthermore, as will be described below, this also allows for increasing a bonding area with the lens member 70.

Light emitted from each semiconductor laser element 20 and reflected by the light-reflective surface of a corresponding light-reflective member 40 is incident on the lower surface of the light-transmissive member 60 while spreading. That is, the lower surface of the light-transmissive member 60 can be regarded as the light incident surface. Light propagating along the optical axis is perpendicularly incident on the lower surface of the light-transmissive member 60.

In the lower surface or the upper surface of the light-transmissive member 60, the direction M corresponding to the perpendicular direction of the FFP is the first direction X, and the direction N corresponding to the parallel direction of the FFP is the second direction Y. 80% or more of the incident light is transmitted to be emitted from the upper surface of the light-transmissive member 60. That is, a region of the light-transmissive member 60 through which light passes is light-transmissive.

Bonding the light-transmissive member 60 to the base member 10 forms a closed space where the semiconductor laser elements 20 are disposed. When open space, such as a recess, is closed to be a closed space, the light-transmissive member 60 can be regarded as a cover.

The closed space where the semiconductor laser elements 20 are disposed is hermetically sealed. Hermetic sealing allows for inhibiting attraction of organic substances or the like to the light emission end surfaces of the semiconductor laser elements 20.

Next, the lens member 70 is disposed above the light-transmissive member 60, and is secured to the light-transmissive member 60. The lens member 70 is adjusted and secured to a position that allows light emitted from the light-transmissive member 60 to be properly controlled by the lenses. An adhesive agent is applied between the lens member 70 disposed at the position where it is to be fixed and the light-transmissive member 60. The lens member 70 is secured by the adhesive agent, and the adhesive agent is cured to obtain the adhesive part 80.

The lens member 70 is disposed so that one of the connected lenses controls light from a corresponding semiconductor laser element 20. Accordingly, the connected four lenses is configured to control respective light beams from the four semiconductor laser elements 20.

More Specifically, in the light emitting device 1, light transmitted through the lenses of the lens member 70 is collimated and emitted from the lens member 70. That is, the lens member 70 includes collimating lenses. With the collimating lenses, light not collimated when incident on the light-transmissive member 60 is transmitted through the light-transmissive member 60 while spreading, and is transmitted through the lens member 70, to be a collimated light and emitted. Note that, configurations other than collimating may be employed for control of light, and condensing or diffusing may be employed.

The lens member 70 is disposed such that the lens connecting direction P and the alignment direction of the semiconductor laser elements 20 (the second direction Y) agree with each other in a top view. The lens member 70 is disposed such that the lens connecting direction P and the direction N corresponding to the parallel direction of the FFP and incident on the lens member 70 agree with each other, and the direction perpendicular to the connecting direction P (the first direction X) in a top view and the direction M corresponding to the perpendicular direction of the FFP incident on the lens member 70 agree with each other.

The lens member 70 is disposed so that light emitted from each semiconductor laser element 20 propagating along the optical axis is transmitted through the apex of corresponding lens (a portion of the lens at the highest position in the top-bottom direction of the lens). In a top view, the lens region 7 has two opposite ends including a first end and a second end in the width in the first direction X, such that the first end is located at the upper surface of the base member 10, and the second end is located inward of the inner lateral surfaces (inside the recess in a top view). In order to control a greater amount of light and to downsize the light emitting device 1, the first end is located above the upper surface of the base member 10.

On the other hand, in connection with the lens member 70, two opposite ends in the width of the lens region 72 in the second direction Y are not located at the upper surface of the base member 10 in a top view, but are located inward of the inner lateral surfaces. That is, the lens member 70 is disposed such that the lens region 72 is positioned between the opposite first lateral surfaces 14 in a top view. With the stepwise portions 13 located at the first lateral surfaces 14, the lens region 72 can be located inward of the first lateral surfaces 14.

In a top view, the region where the adhesive agent is provided (the region where the adhesive part 80 is disposed) overlaps with the planar region 71 of the lens member 70 and does not overlap with the lens region 72. Accordingly, the adhesive agent is disposed in the vicinity of the outer edge of the lower surface of the lens member 70. The adhesive agent is provided in the vicinity of the sides extending in the first direction X, of four sides of the lower surface of the lens member 70.

In the planar region 71 of the lens member 70, the width W1 in the connecting direction P is greater than the width W2 in the direction perpendicular to the connecting direction P. This allows for increasing the bonding area with the light-transmissive member 60. In such a manner, the light emitting device 1 is manufactured.

Experimental data on the relationship between the plane orientation of sapphire or the light incident direction and the polarization ratio of light will be described below.

Figure 9:
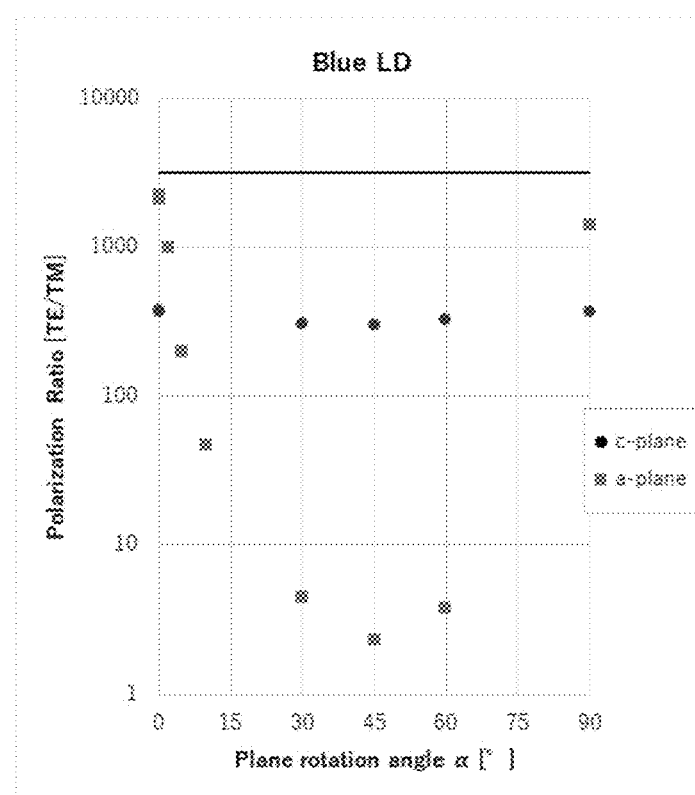
FIG. 9 shows experimental data obtained by measuring the polarization ratio while varying angles in a plane direction of the light-transmissive member formed of sapphire.
Figure 10:
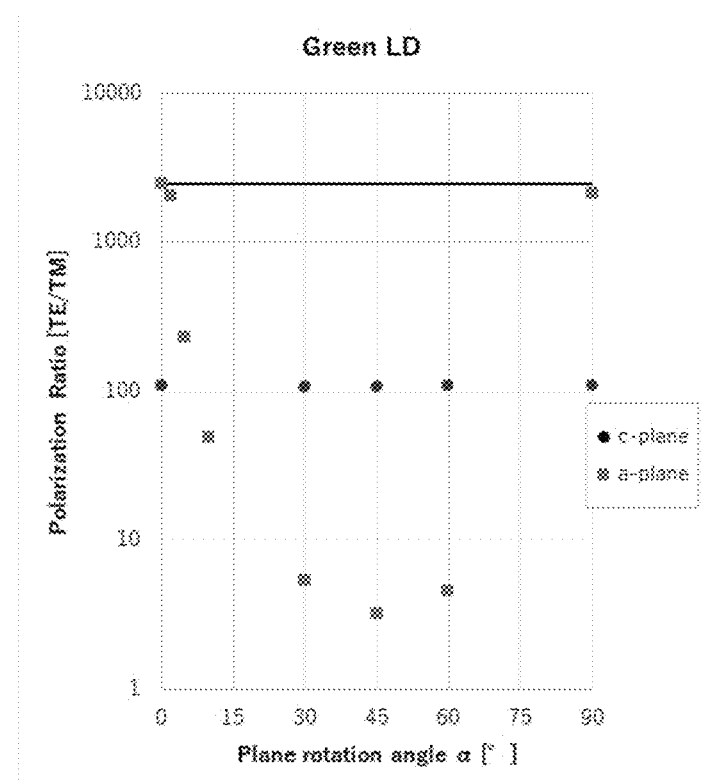
FIG. 10 shows experimental data obtained by measuring the polarization ratio while varying angles in the plane direction of the light-transmissive member formed of sapphire.
Figure 11:
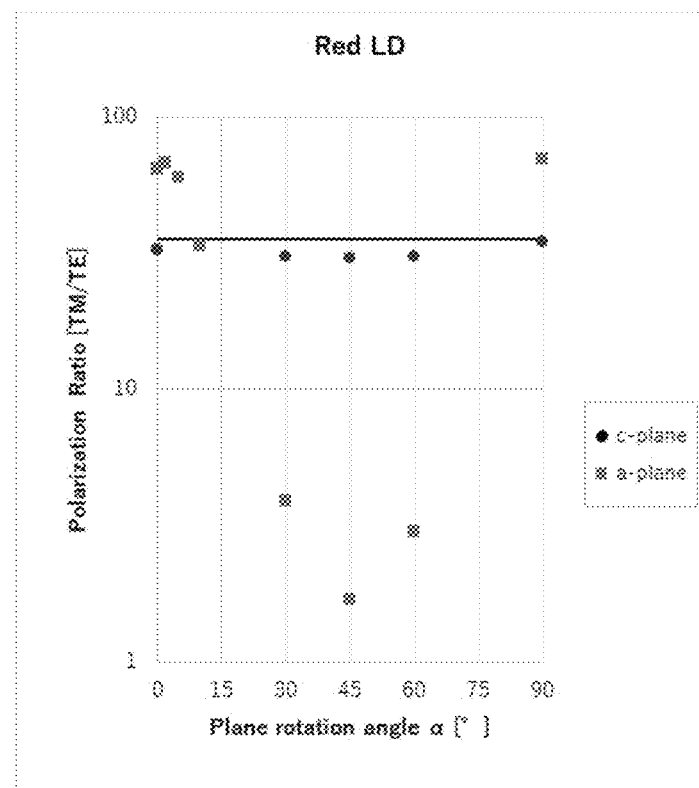
FIG. 11 shows experimental data obtained by measuring the polarization ratio while varying angles in the plane direction of the light-transmissive member formed of sapphire.
Figure 12:
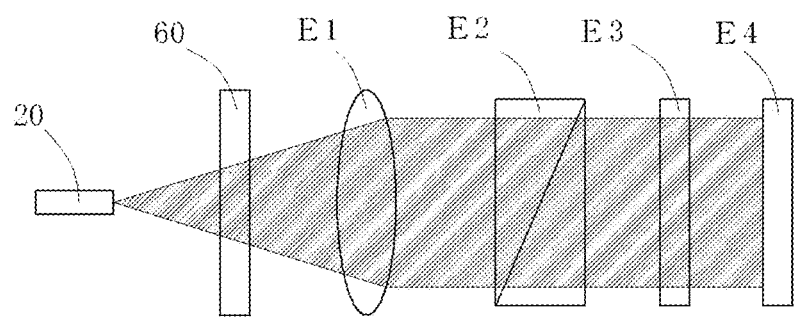
FIG. 12 is a schematic diagram showing the experiment condition of FIGS. 9 to 11.

FIGS. 9 to 11 show experimental data obtained by measuring the polarization ratio with the light-transmissive member 60 made of sapphire, while varying angles in the plane directions for each of the case in which the incident plane is the a-plane and the case in which it is the c-plane. FIG. 9 shows the experimental data where TE-mode semiconductor laser elements emitting blue light are used for the semiconductor laser elements 20. FIG. 10 shows the experimental data where TE-mode semiconductor laser elements emitting green light are used for the semiconductor laser elements 20. FIG. 11 shows the experimental data where TM-mode semiconductor laser elements emitting red light are used for the semiconductor laser elements 20. FIG. 12 is a schematic diagram showing the experiment condition under which the experimental data shown in FIGS. 9 to 11 is obtained.

As shown in FIG. 12, in this experiment, measurement was performed in a state in which light propagating along the optical axis of light emitted from the semiconductor laser element 20 is perpendicularly incident on the incident surface of the light-transmissive member 60. Furthermore, measurement was performed at various angles with the light-transmissive member 60 rotated about the optical axis while maintaining the perpendicular incident state. In the description below, this angle is referred to as a "plane rotation angle $\alpha$."

In the case in which the incident surface is the a-plane, the plane rotation angle $\alpha$ where the direction corresponding to the perpendicular direction of the FFP and the c-axis of sapphire are parallel to each other was defined as 0 degrees, and the plane rotation angle $\alpha$ where the direction corresponding to the perpendicular direction of the FFP and the c-axis of sapphire are perpendicular to each other was defined as 90 degrees. FIG. 8 shows the values of the plane rotation angles $\alpha$ where the incident surface of the light-transmissive member 60 of the light emitting device 1 is the a-plane of sapphire and the c-axis is oriented as indicated by the arrow in FIG. 8.

In the case in which the incident surface is the c-plane, the plane rotation angle α where the direction corresponding to the perpendicular direction of the FFP and the a-axis of sapphire are parallel to each other was defined as 0 degrees, and the plane rotation angle α where the direction corresponding to the perpendicular direction of the FFP and the a-axis of sapphire are perpendicular (parallel to the m-axis) was defined as 90 degrees.

Both the light-transmissive member 60 with an incident surface of the a-plane and the light-transmissive member 60 with an incident surface of the c-plane had a thickness of 500 μm. The polarization ratio measured without the light-transmissive member 60 was 3134 TE/TM for blue light, 2487 TE/TM for green light, and 36 TM/TE for red light. For comparison purposes, in FIGS. 9 to 11, the polarization ratio without the light-transmissive member is indicated by the solid line.

In measurement, Glan-Laser calcite polarizer available from Thorlabs, Inc. was used as a polarizer E2, a metal film ND filter available from Melles Griot K. K. was used as a ND filter E3, and a detector photodiode available from Hamamatsu Photonics K. K. was used as a detector photodiode E4.

According to the measurement results in FIGS. 9 to 11, it can be understood that, when the incident surface is the c-plane, the polarization ratio does not greatly change in response to a change in the angle. That is, it is considered that the c-plane has no or very small dependence of polarization ratio on rotation of the plane direction.

On the other hand, when the incident surface is the a-plane, the polarization ratio changes in response to a change in the plane rotation angle α. It can be understood that the polarization ratio is reduced when the plane rotation angle α increases from 0 degrees to 45 degrees, and increases when the plane rotation angle α increases from 45 degrees to 90 degrees. Also, it can be understood that the polarization ratio is the greatest at 0 degrees or 90 degrees, and is the lowest at 45 degrees.

When the plane rotation angle α is 45 degrees, the polarization ratio is greatly reduced. As shown in each of FIGS. 9 to 11, a polarization ratio was not good when the plane rotation angle α was in a range of 30 degrees to 60 degrees, and the value of polarization ratio was in a range of 1 to 5.

On the other hand, the high polarization ratio was obtained when the plane rotation angle α is 0 degrees and 90 degrees. That is, it is considered that a good polarization ratio is obtained when the plane rotation angle α is 0 degrees or 90 degrees, for both of TE-mode light and TM-mode light. Accordingly, it is considered that even a light emitting device including both TE-mode and TM-mode semiconductor laser elements can have a good polarization ratio.

Furthermore, it is considered that a good polarization ratio is obtained also with a light emitting device in which the direction corresponding to the perpendicular direction of the FFP and the direction corresponding to the parallel direction of the FFP in the incident surface are different from each other by 90 degrees in a top view. For example, it is considered that a good polarization ratio is obtained also with the light emitting device 1 in which two semiconductor laser elements 20 are disposed so that light emitted from the two semiconductor laser elements propagate along respective optical axes in directions different from each other by 90 degrees in a top view, and the light-reflective members 40 are disposed so as to respectively cause the light propagating along the optical axes to advance perpendicularly upward.

As shown in FIG. 11, light with a low polarization ratio value (light with polarization ratio value of a two-digit number) before transmitted through the light-transmissive member 60 has the polarization ratio value higher after transmitted through the light-transmissive member 60 with a plane rotation angle α of 0 degrees or 90 degrees than before transmitted through the light-transmissive member 60. From FIGS. 9 and 10, it can be understood that, light having a high polarization ratio value (the light with polarization ratio value of a four-digit value) before transmitted through the light-transmissive member 60 has the polarization ratio value substantially the same or lower after transmitted through the light-transmissive member 60 with a plane rotation angle α of 0 degrees or 90 degrees than before transmitted through the light-transmissive member 60.

With reference to FIGS. 9 and 10, the polarization ratio that was 2000 or more with a plane rotation angle α of 0 degrees was reduced to about 200 with a plane rotation angle α of 5 degrees, and was reduced to about 50 with a plane rotation angle α of 10 degrees. With reference to FIG. 11, with a plane rotation angle α of 10 degrees, the polarization ratio value was lower than the value of light before transmitted through the light-transmissive member 60.

These result shows high dependence of the polarization ratio on the plane rotation angle α when the a-plane is the incident surface. Furthermore, it is considered that, in order to obtain a good polarization ratio, the plane rotation angle α is preferably in a range of 0 degrees to 10 degrees, or a range of 80 degrees to 90 degrees. This is similar in the case in which a plane rotation angle α is in a range of 90 degrees to 180 degrees, 180 degrees to 270 degrees, 270 degrees to 360 degrees.

The maximum value of the polarization ratio in the a-plane than that in the c-plane. That is, with a plane rotation angle α of 0 degrees or 90 degrees, a polarization ratio can be higher in the a-plane than in the c-plane.

Figure 13:
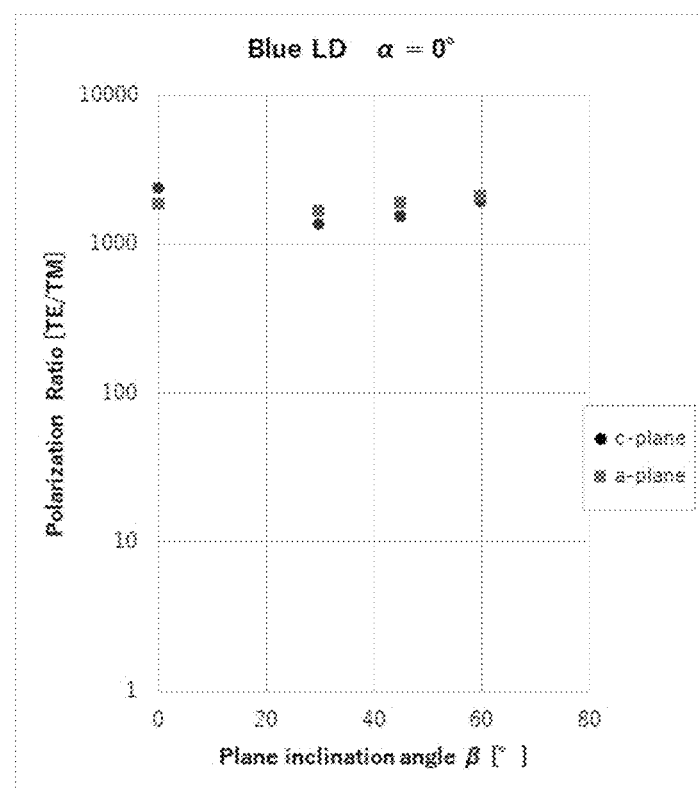
FIG. 13 shows experimental data obtained by measuring the polarization ratio while varying the angle in the height direction of the light-transmissive member formed of sapphire.
Figure 14:
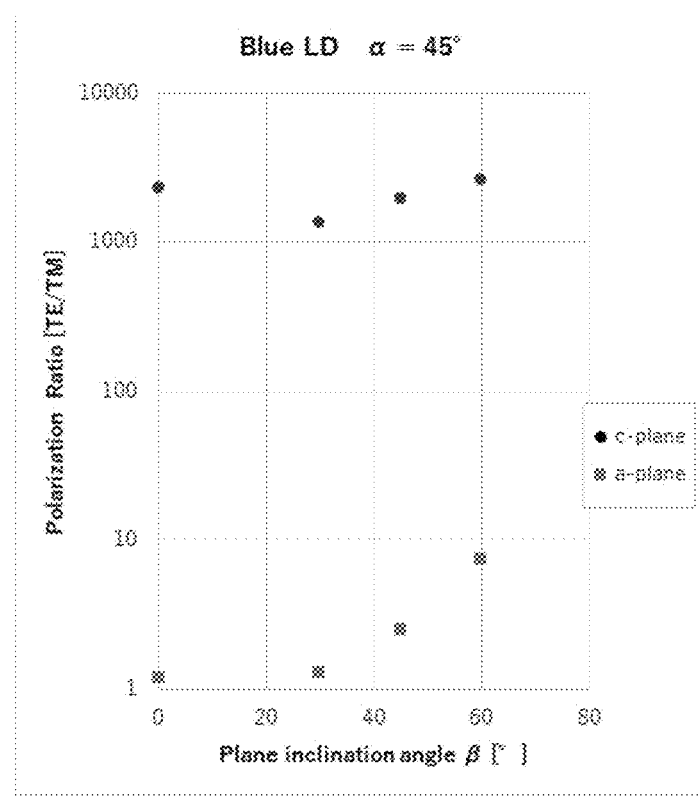
FIG. 14 shows experimental data obtained by measuring the polarization ratio while varying the angle in the height direction of the light-transmissive member formed of sapphire.
Figure 15:
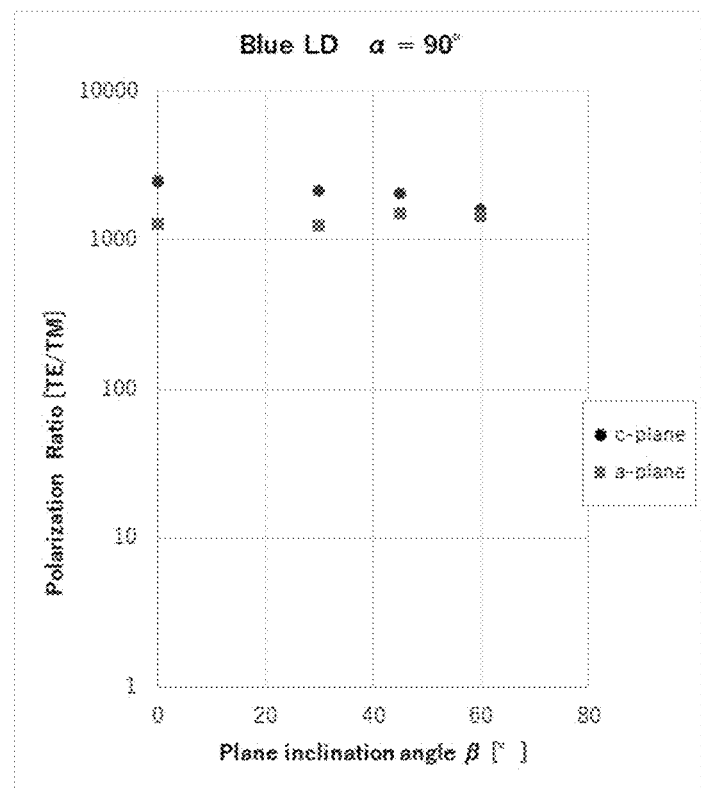
FIG. 15 shows experimental data obtained by measuring the polarization ratio while varying the angle in the height direction of the light-transmissive member formed of sapphire.

FIGS. 13 to 15 show experimental data obtained by measuring the polarization ratio with the light-transmissive member 60 made of sapphire, while varying the light incident angles on the incident surface for each of the case in which the incident surface is the a-plane and the incident surface is the c-plane. In the description below, this incident angle is referred to as a "plane inclination angle β." FIG. 13 shows experimental data with a plane rotation angle α of 0 degrees.

Figure 16:
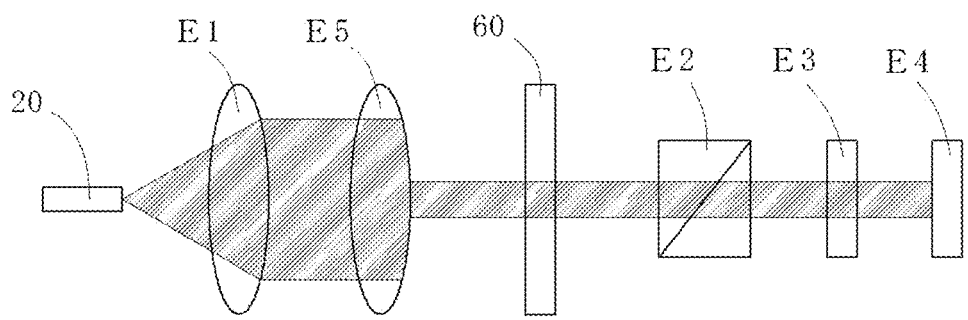
FIG. 16 is a schematic diagram showing the experiment condition in FIGS. 12 to 15.

FIG. 14 shows experimental data with a plane rotation angle α of 45 degrees. FIG. 15 shows experimental data with a plane rotation angle α of 90 degrees. FIG. 16 is a schematic diagram showing the experiment condition under which the experimental data shown in FIGS. 13 to 15 is obtained.

As shown in FIG. 16, this experiment is different from the experiment shown in FIG. 12, in which spreading light of FFP is allowed to be incident on the light-transmissive member 60. In this experiment, light propagating along the optical axis of light emitted from the semiconductor laser element 20 is collimated by a collimating lens E1 and narrowed by a diaphragm E5 before incident on the light-transmissive member 60.

Figure 18:
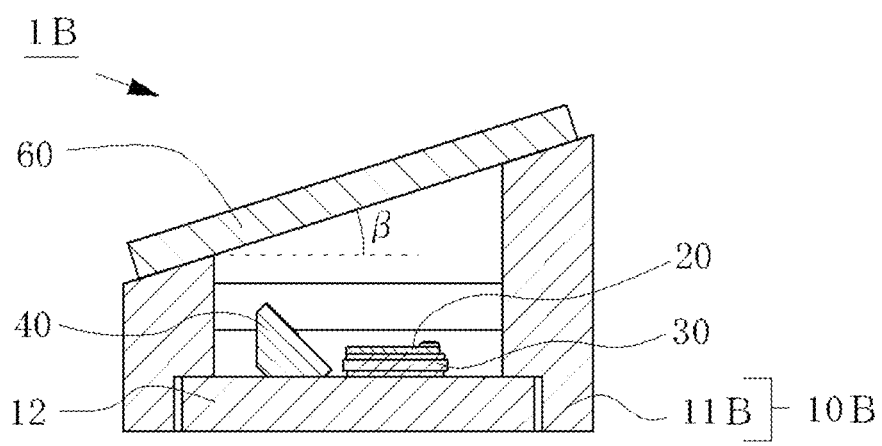
FIG. 18 is a cross-sectional view of a light emitting device according to another embodiment.

The expression "a plane inclination angle β of 0 degrees in the graphs of FIGS. 13 to 15" indicates the state where light propagating along the optical axis is perpendicularly incident on the incident surface. That is, the disposition of the light-transmissive member 60 in the light emitting device 1 corresponds to the state of 0 degrees. Therefore, when the plane inclination angle β is 90 degrees, light is not incident on the lower surface of the light-transmissive member 60 but is incident on a lateral surface of the light-transmissive member 60. FIG. 18 shows the case in which the light-transmissive member 60 is disposed to be inclined (where the plane inclination angle β is 0°<β<90°).

The thickness of the light-transmissive member 60 and the polarizer E2, the ND filter E3, and the detector photodiode E4 that are employed are similar to those shown in FIG. 12. FIGS. 13 to 15 show the measurement result using a semiconductor laser element emitting blue light as the semiconductor laser element 20, similarly to the measurement shown in FIG. 9.

From the measurement result shown in FIGS. 13 to 15, it can be understood that change in the polarization ratio in response to a change in degrees is greater in the c-plane than in the a-plane. Also, it can be understood that change in polarization ratio in response to a change in degrees is small in the a-plane. That is, the polarization ratio is not dependent or less dependent on the plane inclination angle β in the a-plane.

Neither the a-plane nor the c-plane show a significant change in a polarization ratio according to the angle of the plane inclination angle (3, such as reduction of a polarization ratio of 1000 or more to a two- or one-digit value.

With reference to FIGS. 13 and 15, The greater the planar inclination angle β is, the closer the polarization ratio value in the c-plane to the polarization ratio value in the a-plane. According to this result, it is considered that the characteristic of the polarization ratio is not greatly varied in a plane parallel to the c-axis.

That is, a plane rotated at the plane inclination angle β by 90 degrees from the c-plane is a plane parallel to the c-axis, and the direction corresponding to the perpendicular direction of the FFP and the c-axis of sapphire are parallel to each other. The a-plane is also parallel to the c-axis, and with a plane rotation angle α of 90 degrees (FIG. 15), the a-plane is parallel to the c-axis irrespective of the plane inclination angle β (for example, a plane inclined by 90 degrees is the m-plane). Accordingly, it is considered that a plane parallel to the c-axis allows for obtaining a measurement result similar to that in the a-plane.

Comparing with FIG. 9, it can be understood that, in the c-plane, the collimating caused great increase of the polarization ratio. That is, when light is transmitted through the c-plane, the collimation of transmitted light (degree of collimation of the collimated light) greatly influences the polarization ratio. On the other hand, in the a-plane, the polarization ratio is not greatly varied according to whether light that spreads or light that does not spread (i.e., collimated light) is incident.

Comparing the c-plane and the a-plane against each other with collimated light, with a plane rotation angle α of 0 degrees, the polarization ratio value in the c-plane is greater than that in the a-plane. Accordingly, when a collimated light is incident, a light-transmissive member having an incident surface of the c-plane can have a higher polarization ratio than a light-transmissive member having an incident surface of the a-plane.

According to the experiment result described above, with respect to a light-transmissive member made of sapphire, a consideration as described below can be made as to the case in which the incident surface is a plane parallel to the c-axis and the case in which the incident surface is a plane parallel to the c-plane.

Case in which the Incident Surface is a Plane Parallel to the c-Axis

In the incident surface, setting the direction corresponding to the perpendicular direction of the FFP (the major-axis direction of an oval shape) of laser light to be parallel or perpendicular to the c-axis allows for obtaining a good polarization ratio. Setting the polarization direction of laser light becoming incident on the incident surface to be parallel or perpendicular to the c-axis allows for obtaining a good polarization ratio is obtained. In other words, setting the s-polarization or the p-polarization to be parallel to the c-axis allows for obtaining a good polarization ratio. When light with a small polarization ratio value before transmission is transmitted through a light-transmissive member, the polarization ratio value of the transmitted light is greater than before transmission. As used herein, the expression "light with a small polarization ratio value" refers to, for example, light having polarization ratio in a range of 1 to 50. Even when light propagating along the optical axis is not perpendicularly incident on the incident surface but is obliquely incident, the polarization ratio value will not be greatly varied and a stable polarization ratio is obtained. In other words, with an incident angle of the light propagating along the optical axis relative to the incident surface (the plane inclination angle β) in a range of 0 degrees to 90 degrees, a stable polarization ratio can be obtained. Accordingly, in the light emitting device 1, it can be regarded that a good polarization ratio can be obtained when the direction corresponding to the perpendicular direction of the FFP or the polarization direction of laser light from the semiconductor laser element 20 and the c-axis direction in the light-transmissive member 60 formed of sapphire are parallel or perpendicular to each other in a top view (or in a bottom view). A polarization ratio of collimated light and a polarization ratio of spreading light do not largely differ from each other.

Case in which the Incident Surface is the c-Plane

When the incident surface is rotated about an axis perpendicular thereto, the polarization ratio does not largely change and a stable polarization ratio is obtained. By collimating light before the light is incident on the incident surface, a better polarization ratio can be obtained than a polarization ratio when light not collimated is incident on the incident surface.

As described above, locating a plane parallel to the c-axis of sapphire such as the a-plane or the m-plane, or the c-plane, under an appropriate condition, a good polarization ratio can be obtained. The expression "good polarization ratio" in the present specification refers to a polarization ratio required for an optical device 2.

Figure 17:
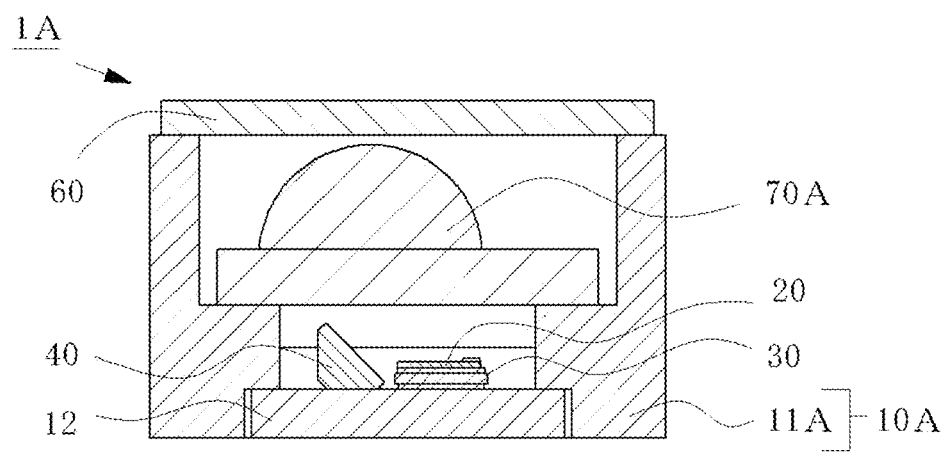
FIG. 17 shows experimental data obtained by measuring the polarization ratio while varying the thickness of the light-transmissive member formed of sapphire.

FIG. 17 is a cross-sectional view showing another embodiment of the light emitting device. In a light emitting device 1A shown in FIG. 17, in a frame part 11A of a base member 10A, a lens member 70A is disposed below the light-transmissive member 60. Accordingly, light collimated by the lens member 70A is incident on the light-transmissive member 60. In such a light emitting device 1A, the incident surface of the light-transmissive member 60 is preferably the c-plane of sapphire. The incident surface of the light-transmissive member 60 may also be the a-plane.

FIG. 18 is a cross-sectional view showing other embodiment of the light emitting device. In a light emitting device 1B shown in FIG. 18, an upper surface of a frame part 11B of a base member 10B is inclined. Accordingly, the light-transmissive member 60 is also disposed to be inclined. Thus, light propagating along the optical axis is not perpendicularly incident on the incident surface of the light-transmissive member 60. Furthermore, laser light incident on the light-transmissive member 60 is not collimated, and is transmitted through the light-transmissive member 60 while spreading. In such a light emitting device 1B, the incident surface of the light-transmissive member 60 is preferably the a-plane that is parallel to the c-axis of sapphire.

Next, a liquid crystal projector will be described below as one example of the optical device 2 including the light emitting device according to one embodiment. Examples of the basic configuration of a liquid crystal projector is described in patent publications such as, for example, JP 2018-92112 A, JP 2018-141994 A, and JP 2019-3209 A. As can be seen from description in these publications and other conventional techniques, the liquid crystal projector includes a light source 201, a polarizer element 202, a liquid crystal panel 203, a projection lens 204 and others.

Light emitted from the light source 201 is transmitted through the polarizer element 202 before reaching the liquid crystal panel 203. For the polarizer element 202, for example, a beam splitter is used. With such a structure, one polarization component of the light emitted from the light source 201 is reflected, and other polarization component is transmitted. That is, the mechanism of the liquid crystal projector is configured such that only a particular polarization component is incident on the liquid crystal panel 203. The liquid crystal projector having such a configuration requires light of an good polarization ratio. For example, the light source 201 is demanded of emitting light having polarization ratio value of 100 or more.

Figure 19:
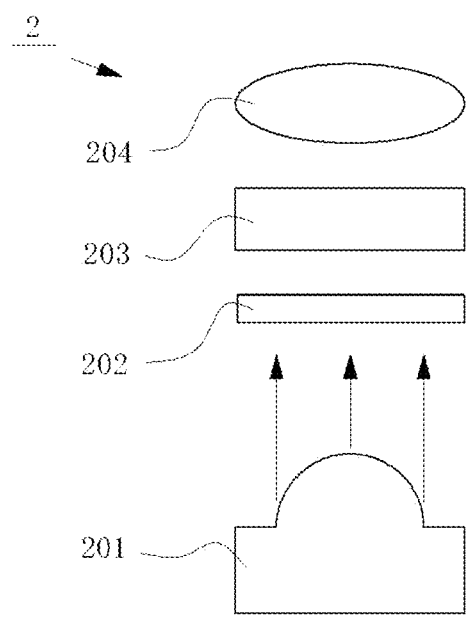
FIG. 19 is a schematic diagram, of a liquid crystal projector equipped with the light emitting device according to the embodiment of FIG. 18.

Accordingly, as shown in FIG. 19, the liquid crystal projector in which the light emitting device according to one embodiment is employed as the light source 201 can efficiently cause light of a particular polarization component to be incident on the liquid crystal panel 203. More specifically, the liquid crystal projector includes the light emitting device 1. The liquid crystal projector further includes the polarizer element 202 on which light emitted from the light emitting device 1 is incident. The liquid crystal projector further includes the liquid crystal panel 203 on which light emitted from the light emitting device 1 and transmitted through the polarizer element 202 is incident. The liquid crystal projector further includes the projection lens 204 projecting a projection image created according to light emitted from the light emitting device 1. The liquid crystal projector may further include other components.

While certain embodiments of a light emitting device and an optical device have been described above, the light emitting device and the optical device according to the present invention are not limited to those in the embodiments described above. That is, the present invention can be implemented without limitation of the outer shape or configuration of the light emitting device and the optical device to those in the embodiments described above. The present invention is also applicable to a device not including all elements illustrated in the embodiments described above. For example, when the claims do not recite some elements of the light emitting device in the embodiments described above, a light emitting device in which replacement, omission, modification, change in material, or the like of such elements is made by a person skilled in the art is within the scope of the claims. Thus, design flexibility of such elements is allowed for application of the present invention.

The light emitting device according to the embodiments is applicable to a light source for a projector, a vehicle headlight, illumination, a display device, and the like.

What is claimed is:

1. A light emitting device comprising:
at least one semiconductor laser element;
a base member on which the at least one semiconductor laser element is disposed;
a light-transmissive member including:
an upper surface,
a lower surface, and
a light-transmissive region through which laser light emitted from the at least one semiconductor laser element is transmitted from the lower surface to the upper surface; and
a lens member through which the laser light emitted from the at least one semiconductor laser element, the lens member being fixed to the base member or the light-transmissive member, wherein:
at least the light-transmissive region is made of sapphire, and
the light-transmissive member includes an incident surface on which the laser light is incident, the incident surface being an a-plane of the sapphire.

2. The light emitting device according to claim 1, wherein:
the light-transmissive member is oriented such that a polarization direction of the laser light incident on the incident surface is parallel or perpendicular to a c-axis of the sapphire in a top view.

3. The light emitting device according to claim 1, wherein:
the at least one semiconductor laser element comprises a plurality of the semiconductor laser elements, and
the incident surface of the light-transmissive member is oriented so that a polarization direction of beams of the laser light emitted from the plurality of semiconductor laser elements is parallel to or perpendicular to the c-axis of the sapphire in a top view.

4. The light emitting device according to claim 1, wherein the at least one semiconductor laser element includes a TE-mode semiconductor laser element and a TM-mode semiconductor laser element.

5. The light emitting device according to claim 1, wherein:
the at least one semiconductor laser element includes a first semiconductor laser element and a second semiconductor laser element, and
a propagation direction of light emitted from the first semiconductor laser element and propagating along the optical axis of the first semiconductor laser element and a propagation direction of light emitted from second semiconductor laser element and propagating along the optical axis of the second semiconductor laser element are different from each other by 90 degrees in a top view.

6. The light emitting device according to claim 1, wherein:
the laser light emitted from the light-transmissive member is transmitted through the lens member.

7. The light emitting device according to claim 1, wherein:
a thickness of the light-transmissive member between the incident surface on which the laser light is incident and an emission surface from which the laser light is emitted is in a range of 0.3 mm to 1.0 mm.

8. The light emitting device according to claim 1, further comprising:
   at least one light-reflective member disposed on the base member and including a light-reflective surface configured to reflect the light emitted from the at least one semiconductor laser element, wherein:
   the laser light reflected by the at least one light-reflective member is incident on the incident surface.

9. A light emitting device comprising:
   at least one semiconductor laser element;
   a base member on which the at least one semiconductor laser element is disposed;
   a light-transmissive member including:
      an upper surface,
      a lower surface, and
      a light-transmissive region through which laser light emitted from the at least one semiconductor laser element is transmitted from the lower surface to the upper surface; and
   a lens member through which the laser light emitted from the at least one semiconductor laser element, the lens member being fixed to the base member or the light-transmissive member, wherein:
   at least the light-transmissive region is made of sapphire, and
   the light-transmissive member includes an incident surface on which the laser light is incident, the incident surface being an m-plane of the sapphire.

10. The light emitting device according to claim 9, wherein:
    the light-transmissive member is oriented such that a polarization direction of the laser light incident on the incident surface is parallel or perpendicular to a c-axis of the sapphire in a top view.

11. The light emitting device according to claim 9, wherein:
    the at least one semiconductor laser element comprises a plurality of the semiconductor laser elements,
    the incident surface of the light-transmissive member is oriented so that a polarization direction of beams of the laser light emitted from the plurality of semiconductor laser elements is parallel to or perpendicular to the c-axis of the sapphire in a top view.

12. The light emitting device according to claim 9, wherein:
    the at least one semiconductor laser element includes a TE-mode semiconductor laser element and a TM-mode semiconductor laser element.

13. The light emitting device according to claim 9, wherein:
    the at least one semiconductor laser element includes a first semiconductor laser element and a second semiconductor laser element, and
    a propagation direction of light emitted from the first semiconductor laser element and propagating along the optical axis of the first semiconductor laser element and a propagation direction of light emitted from second semiconductor laser element and propagating along the optical axis of the second semiconductor laser element are different from each other by 90 degrees in a top view.

14. The light emitting device according to claim 9, wherein:
    the laser light emitted from the light-transmissive member is transmitted through the lens member.

15. The light emitting device according to claim 9, wherein:
    a thickness of the light-transmissive member between the incident surface on which the laser light is incident and an emission surface from which the laser light is emitted is in a range of 0.3 mm to 1.0 mm.

16. The light emitting device according to claim 9, further comprising:
    at least one light-reflective member disposed on the base member and including a light-reflective surface configured to reflect the light emitted from the at least one semiconductor laser element, wherein:
    the laser light reflected by the at least one light-reflective member is incident on the incident surface.

* * * * *